United States Patent
Bigelow et al.

[11] Patent Number: 5,976,206
[45] Date of Patent: Nov. 2, 1999

[54] METHOD OF MAKING WHITE DIAMOND FILM

[75] Inventors: Louis K. Bigelow, Boylston, Mass.; Kevin J. Gray, Nashua, N.H.; Grant Lu, Shrewsbury; Matthew A. Simpson, Arlington, both of Mass.; Gordon L. Cann, Laguna Beach, Calif.

[73] Assignee: Saint-Gobain/Norton Industrial Ceramics Corporation, Worcester, Mass.

[21] Appl. No.: 09/016,014

[22] Filed: Jan. 30, 1998

Related U.S. Application Data

[62] Division of application No. 08/445,399, May 19, 1995, Pat. No. 5,736,252.

[51] Int. Cl.⁶ ........................................... B23P 15/28
[52] U.S. Cl. ........................ 51/307; 51/295; 407/119; 428/408; 428/457
[58] Field of Search ........................... 51/295, 307, 309; 407/119; 428/408, 457

[56] References Cited

U.S. PATENT DOCUMENTS

| | | | |
|---|---|---|---|
| 4,844,785 | 7/1989 | Kitabatake et al. | 204/192.11 |
| 4,859,490 | 8/1989 | Ikegaya et al. | 427/577 |
| 4,987,002 | 1/1991 | Sakamoto et al. | 427/450 |
| 4,988,421 | 1/1991 | Drawl et al. | 427/249 |
| 5,020,394 | 6/1991 | Nakamura et al. | 407/119 |
| 5,055,318 | 10/1991 | Deutchman et al. | 204/192.11 |
| 5,104,634 | 4/1992 | Calcote | 427/577 |
| 5,204,145 | 4/1993 | Gasworth | 427/577 |
| 5,243,170 | 9/1993 | Maruyawa et al. | 427/249 |
| 5,260,106 | 11/1993 | Kawarada et al. | 427/577 |
| 5,342,660 | 8/1994 | Cann et al. | 427/577 |
| 5,364,423 | 11/1994 | Bigelow et al. | 427/577 |
| 5,366,522 | 11/1994 | Nakamura et al. | 51/295 |
| 5,382,293 | 1/1995 | Kawarada et al. | 427/577 |
| 5,736,252 | 4/1998 | Bigelow et al. | 428/408 |

FOREIGN PATENT DOCUMENTS 0577066  1/1994  European Pat. Off. .

*Primary Examiner*—Archene Turner
*Attorney, Agent, or Firm*—Volker R. Ulbrich

[57] ABSTRACT

Diamond film with substantially no non-diamond carbon and a high thermal conductivity is deposited by means of a direct current arc jet apparatus with a substrate temperature below about 975 degrees Celsius, an arc power of between about 20 and 40 kw. A pressure of about 12 torr, and an enthalpy greater than 30 from a activated gas jet fed with hydrogen and methane, the methane being supplied at a concentration of less than 0.07%. The resulting material has a high transparency and thermal conductivity.

Also disclosed is the use of the diamond material made by the present method for cutting tool applications, particularly milling.

4 Claims, 3 Drawing Sheets

METHOD OF MAKING WHITE DIAMOND FILM

This is a divisional of application Ser. No. 08/445,399 filed on May 19, 1995 now U.S. Pat. No. 5,736,252.

FIELD OF THE INVENTION

The invention relates to the making of diamond film by deposition from an activated gas, particularly a gas activated by an electric arc, and to the use of diamond made thereby for cutting tool applications.

BACKGROUND OF THE INVENTION

It is known that polycrystalline diamond can be deposited as a film by low pressure CVD (chemical vapor deposition) from an activated gas mixture which contains active radical species of the appropriate gaseous constituents needed. These species include a facilitating gas, generally atomic hydrogen, and a carbon source gas, generally a hydrocarbon compound. Such an activated gas is also referred to by some as a "plasma," because it is at a high enough temperature for the gases to be at least partially ionized, although others may consider the level ionization to be too low for it to be considered a true plasma.

There are several means known in the art for providing the energy necessary to form and maintain the activated gas. One is by a heated electric filament. Another is by a microwave generator coupled to an appropriate resonant cavity. A third is by combustion, as by a torch. A fourth is by a direct current electric arc system commonly referred to as an "arc jet." An arc jet deposition system of this type is described, for example, in U.S. Pat. No. 4, 682,564 issued Jul. 28, 1987 to Gordon L. Cann. A major distinction between microwave systems and arc jet systems is that microwave systems have a relatively slow growth rate by comparison. Arc jet systems can have a growth rate of more than ten times that of microwave systems.

It has been observed both in microwave and other deposition systems for diamond film that a reduction in the concentration of the carbon source gas for the activated gas mix dramatically reduces the growth rate, while at the same time, however, also improving the quality of the diamond film by reducing the concentration of imperfections present to thereby increase both the optical transparency and the thermal conductivity. The greatest amount of investigative activity in this regard has been with microwave systems. With these systems it has been observed that with methane concentrations less than about 0.1% (Gas concentration percentages are by volume throughout.), the growth rate is so low as to be of little commercial interest. Consequently, there has been little study of diamond film deposition with methane concentrations lower than this 0.1% level.

SUMMARY OF THE INVENTION

In accordance with the novel method of the present invention, diamond film is deposited in an arc jet system at relatively high enthalpy, with a low methane level of 0.07% or less and on a deposition substrate maintained at a relatively low temperature. The result is a diamond film of surprisingly high quality, white in appearance, having both an exceptionally low concentration of imperfections and an exceptionally high thermal conductivity. Furthermore, this material performs surprisingly well as a cutting element.

DETAILED DESCRIPTION

Figure 1:
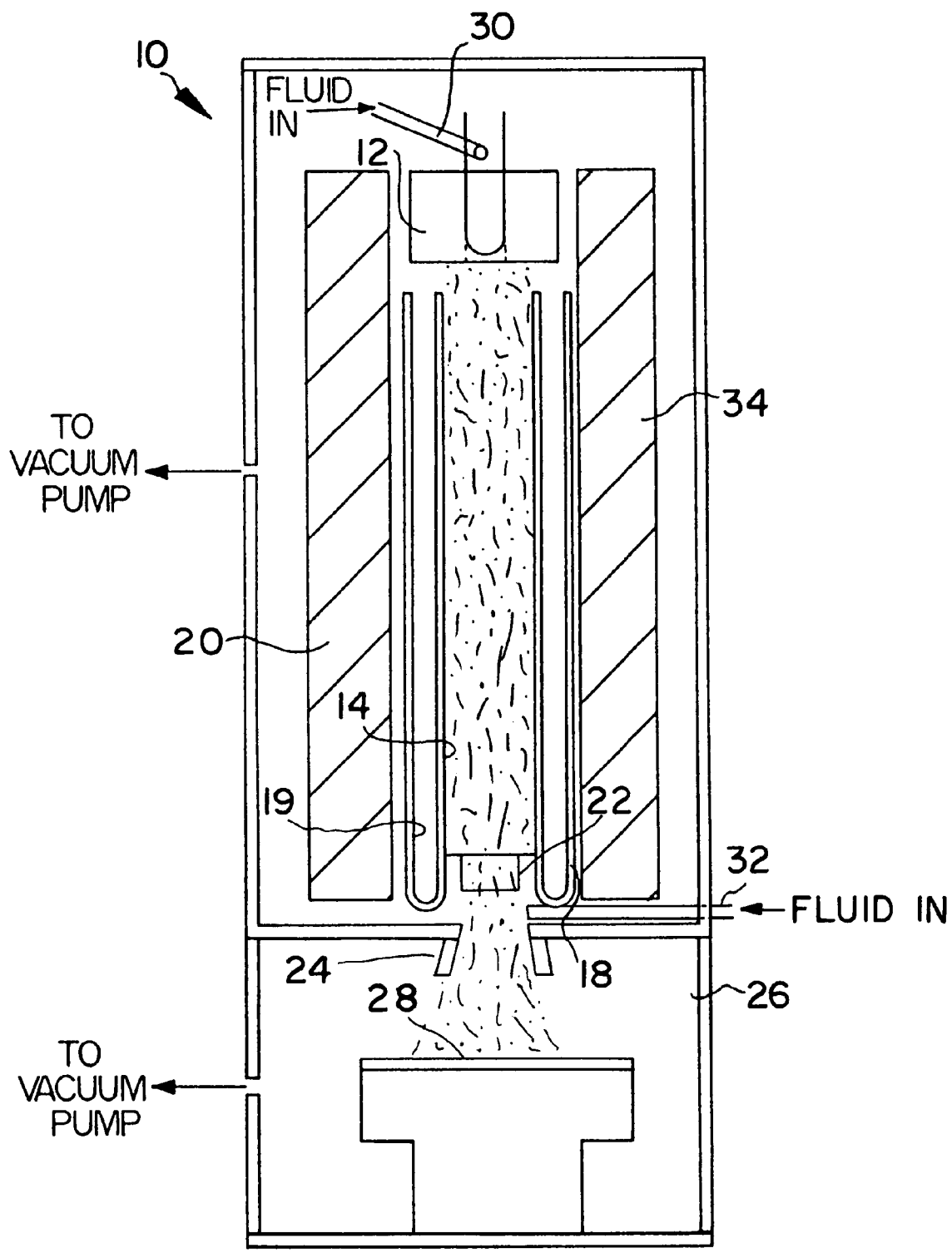
FIG. 1 is a schematic, sectioned, front view of a typical arc jet deposition apparatus known in the art.

For a description of the preferred embodiments of the invention, reference is made to the schematic representation of FIG. 1, which shows an arc jet apparatus 10. The apparatus 10 includes a hollow tubular cathode member 12 at the top end of a hollow barrel 14 in a metal jacket member 18 having an annular space 19 suitable for holding a fluid coolant. The barrel 14 and jacket member 18 are surrounded by a fluid-cooled magnetic coil assembly 20. Longitudinally spaced at the end of the barrel 14 opposite that of the cathode 12 is an anode member 22 having a central opening aligned with the axis of the barrel 14 and leading through a nozzle 24 into an evacuated deposition chamber 26 which has a liquid-cooled deposition substrate 28 spaced from the end of the nozzle 24. A gas injection tube 30 is located at the anode 12 to inject gas into the central opening of the anode 12. Another gas injection tube 32 is located between the anode 22 and the nozzle 24.

In the operation of the arc jet apparatus 10, hydrogen gas is injected through the injector tubes 30 and 32 at a predetermined rate. Between the anode 22 and the nozzle 24, more hydrogen gas, mixed with methane, is injected through the tube 32. The concentration of methane is based on the total percentage of methane injected as a volume percent of the total gas injected through both tubes 30,32. A direct current arc is struck between the cathode 12 and anode 22. The enthalpy of the gas in the barrel is then adjusted by control of the arc power to result in the desired temperature of the substrate 28, which is heated by the gas impinging from the nozzle 24. At this enthalpy, the hydrogen becomes dissociated into a plasma of hydrogen atoms. The magnetic coil assembly 20 around the barrel 14 generates a solenoidal magnetic field which has the effect of swirling the arc about the anode 22 to reduce anode erosion.

The activated gas traveling through the nozzle 24 enters the evacuated deposition chamber 26 and impinges on a fluid-cooled deposition substrate 28 therein to form a diamond film on it. As the methane enters the activated gas through the tube 32, it too becomes partially dissociated into unstable hydrocarbon radical species. At the substrate 28, the hydrogen acts as a facilitating gas for the deposition of the carbon atoms from the activated hydrocarbon radicals as diamond crystallites bonded to each other. The diamond crystallites consist of carbon atoms bonded chemically to each other by what is generally referred to as "sp3" bonds.

Apparatus of the arc jet type, such as the apparatus 10 described above, is known in the art. There are, of course variations is such apparatus and in the methods of operating it. Therefore, many other parameters are involved in the deposition process. However, it is submitted that the most important ones are the enthalpy (kilowatts/gram), vacuum level (torr), substrate temperature (degrees Celsius), and methane concentration (percent). Given these parameter values, the others can be determined for a given apparatus design and method of operation by the skilled operators familiar therewith without the necessity of undue experimentation. Such parameters do not lend themselves well to generalization, since they are dependent on specific apparatus design features.

The gases used must be highly pure with respect to certain elements. There should be an impurity level of less than 1,000 ppm (parts per million) for substances other than hydrogen, carbon, oxygen, argon, and helium. If the objective is to grow a free-standing diamond film, the deposition substrate is preferably molybdenum which has been coated with a thin layer about 3 microns (micro-meters) thick of titanium nitride, such as by vapor deposition, to reduce the adherence of the diamond to the substrate for better release of the film.

EXAMPLES

SUBSTRATE TEMPERATURE AND METHANE CONCENTRATION

A number of diamond film deposition runs were made on an apparatus essentially similar to the jet apparatus 10 described above. In each case, the arc power was between 20 and 40 kilowatts and the deposition rate was between 3 and 6 microns per hour. The temperature of the substrate is in degrees C. (Celsius), and the thickness of the resulting film is in metric microns. Example 1 was deposited in accordance with the present invention, with a substrate temperature below 900 degrees C. and a methane concentration below about 0.07%. Examples 2 and 3 are for comparison and are deposited with higher methane levels of ) 0.07%. Example 4 is also for comparison and is deposited with a low methane level, but a relatively high substrate temperature, above 975 degrees C.

TABLE 1

| example number | enthalpy (kJ/g) | substrate temp. C | % methane | pressure (torr) | thickness |
|---|---|---|---|---|---|
| 1 | 33.6 | 904 | 0.05 | 12 | 750 |
| 2 | 30.5 | 900 | 0.07 | 16 | 620 |
| 3 | 30.7 | 900 | 0.07 | 16 | 460 |
| 4 | 45 | 1050 | 0.058 | 20 | 450 |

OPTICAL TRANSMISSION AND THERMAL CONDUCTIVITY

The resulting diamond film samples were analyzed for characteristics most important for their overall quality, namely optical transmission and thermal conductivity. In general, it was found that the material of example 1 differed markedly from that of examples 2, 3, and 4 in that it was distinctly whiter and more transparent. It also had a substantially higher thermal conductivity. It is noted that these differences can be attributed to the lower methane concentration, lower substrate temperature, and higher enthalpy for the example 1 material, since other parameters were comparable for all three examples. The optical transmission and thermal conductivity are somewhat interrelated in that the presence of imperfections which reduce optical transmission by introducing absorption centers also tends to reduce the thermal conductivity as a result of phonon scattering by these same centers. The results of the analysis are summarized in the below table.

TABLE 2

| example | arc power (kw) | enthalpy (kJ/g) | methane (%) | temp. (C) | pressure (torr) | absorption (%/cm) |
|---|---|---|---|---|---|---|
| 5 | 29 | 32 | 0.051 | 887 | 12 | 4.8 |
| 6 | 31 | 35 | 0.050 | 977 | 12 | 34 |
| 7 | 19 | 70 | 0.21 | 895 | 3.7 | 100 |
| 8 | 16 | 26 | 0.10 | 727 | 10.0 | 47 |
| 9 | 22 | 45 | 0.05 | 1050 | 20.0 | 62 |

The optical absorption was measured at 550 nanometers wavelength, using a Spex UV-VIS-NIR spectrophotometer set up with a 600 line/mm grating and 2 mm (millimeter) slits. The measured quantity is one commonly used for such analysis. It is an absorption coefficient, beta, equal to $-1/t \ln(T/Tmax)$, where T is the transmission; t is the thickness of the sample; and, Tmax is the maximum transmission, that being 0.706 to account for reflection from interfaces. It is again seen from the examples 5–9 that the material of example 5 has a substantially lower absorption than that of examples 6–9. Its absorption corresponds to 57% transmission for the 250 micron thick material. It is also the one deposited with a methane concentration below 0.07% and with a substrate temperature below 975 degrees C. Diamond film in accordance with the present invention is characterized by an optical absorption of less than about 10 per centimeter and a thermal conductivity of at least about 13 watts per centimeter per degree Celsius as measured by the wave convergence method. Such a method is described, for example, in "Measurement of thermal diffusivity of Polycrystalline Diamond Film by the Converging Thermal Wave Technique," by G. Lu and W. T. Swann in Appl. Phys. Letters 59 (13), Sep. 23, 1991. It is generally recognized that there are substantial variations in thermal conductivity measurements from method to method. When measurements of the lateral thermal conductivity are made by the steady state method, the value is about 16,10 watts per centimeter per degree Celsius. Such a method is described, for example, in "Unusually High Thermal Conductivity in Diamond Films," by Graebner et al, Appl. Phys. Letters, 60 (13), Mar. 30, 1992. When measurements of the perpendicular thermal conductivity are made by the laser flash method, the value is about 21.70 watts per centimeter per degree Celsius. Such a method is described, for example, in "Anisotropic Thermal Conductivity in CVD Diamond," by Graebner et al, Journal of Appl. Phys., vol. 71, p. 5353 (1992).

Diamond material with the above qualities of having both a high transparency and also a high thermal conductivity may be particularly useful in certain electronic applications which require a thermal management substrate which is also a light transmission medium. For example, such material could be used as a thermal management substrate for a plurality of electronic devices which would communicated with each other of to the outside by using the substrate itself as an optical bus for signals.

HYDROGEN CONTENT

Because hydrogen has a tendency to attach itself to various types of crystal defects in diamond, a low hydrogen content in diamond film material can be considered an indication that there are few defects and that little non-diamond carbon is present. Several samples were analyzed for hydrogen content using a Digilab FTIR microscope. Infrared absorption was measured over the range 1000/cm to 4000/cm, in which range there are features due to hydrogen around 2850/cm and, due to the diamond itself, around 2000/cm. In each case the diamond was unpolished.

A ratio of the hydrogen peak size to the diamond peak size was computed for the materials of examples 1–3 in the following fashion. Working from data of absorbance versus wave number, baseline points were selected at 1700 and 2334/cm. The area of the curve of absorbance versus wave number above the line joining the absorbance at the baseline points was measured. This area should be proportional to the effective thickness of the diamond. Another set of baseline points at 2750/cm and 3000/cm was selected, and the area of the curve above a line joining these two points was measured. This area should be proportional to the amount of hydrogen along the optical path. The ratio should be proportional to the concentration of hydrogen in the sample. The resulting computed ratios are given in the table 3 below

TABLE 3

| example | ratio |
|---------|-------|
| 1 | 0.0089 |
| 2 | 0.025 |
| 3 | 0.04 |

The results show that the material of Example 1 contained much less hydrogen than that of Examples 2 and 3.

The substrate temperature for all three of the above examples was relatively low, about 850 degrees C. It has been found that a higher substrate temperature of about 1000 degrees C., with all other parameters kept similar, results in material which, while still having a relatively high thermal conductivity, is not white, but rather light brown or gray and not as optically transparent.

The enthalpy for all three of the above examples was relatively high, about 30 or more. It has been found that higher enthalpy, coupled with the reduced substrate temperature and low methane concentration, appears to improve thermal conductivity and transparency.

The above three examples imply that the percentage of methane is much more critical in this range than would reasonably be expected. The samples from Examples 2 and 3 have only 0.02% higher methane concentration, but proved to be of distinctly lower quality in terms of the important characteristics of transparency and thermal conductivity. It may be fair to conclude, therefore, that it is necessary to have a methane level lower than 0.07% for depositing transparent diamond in an arc jet system, with the other conditions as described above.

OPTICAL TRANSMITTANCE

Figure 2:
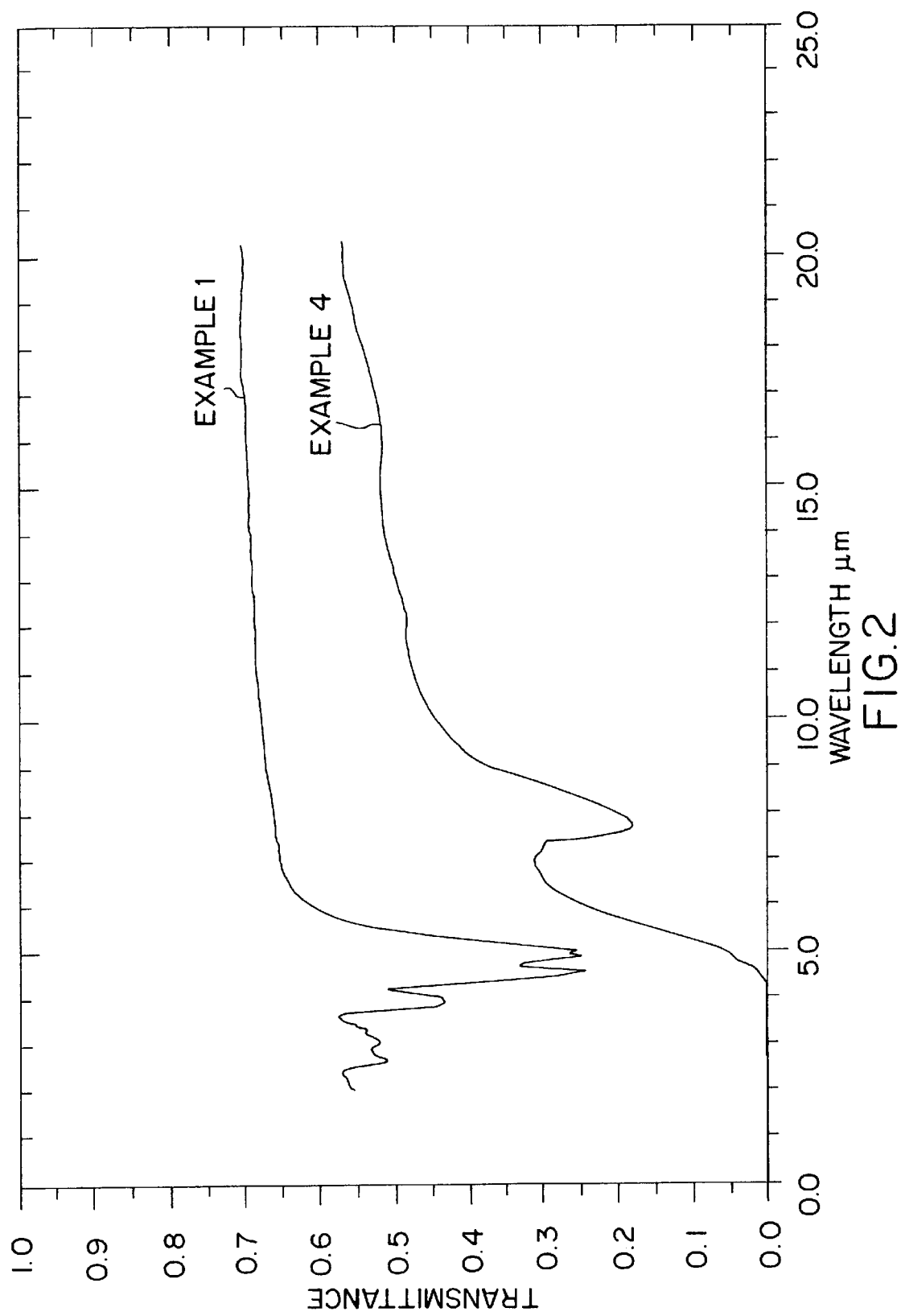
FIG. 2 is a graphical representation of the light transmittance characteristics of diamond film in accordance with the present invention compared with that of prior art diamond film.
Figure 3:
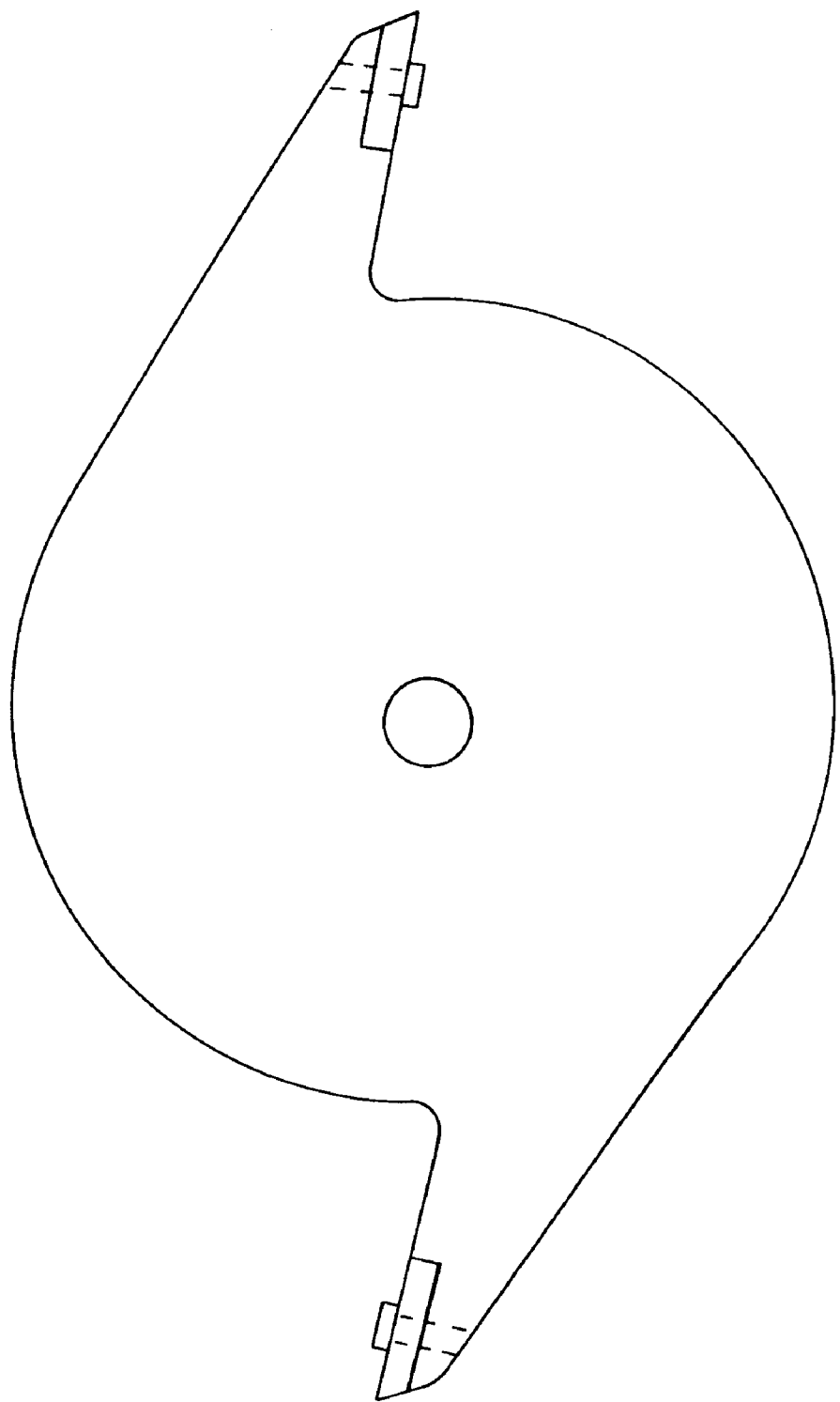
FIG. 3 is a schematic perspective drawing of a cutting tool having a cutting element of diamond material made by the novel method.

The FIG. 2 graph compares the optical transmittance of a sample similar in quality to that of example 1 of tables 1 and 2 above to the material of example 4 of tables 1 and 2. It is seen that the example 1 type of material has a substantially higher optical transmittance throughout the measured range of wavelengths from about 2 to about 20 microns. While the visible wavelength range was not included in the measurements, it can be fairly concluded that in this range also the transmittance of the material of example 4 will be much lower than that of example 1.

CUTTING TOOL PERFORMANCE

A small piece of each of the test materials of Examples 1 through 3 was brazed as a cutter on a milling tool insert and subjected to a cutting tool test. The test involved a cutter speed of 1500 meters per minute with a feed of 0.15 mm/tooth with an axial depth of cut of 1.0 mm. The insert geometry was SPKN1203EDR A-2. The cutter geometry was Sandvik T-MAX A265.2-160ME-20A1-D. The material being milled was continuous cast high-silicon aluminum A390 manufactured by the Mahle company. Flood cooling was used. One insert only was used in the cutter. Tests were conducted for 50 milling passes. Flank wear near the tip of the tool was measured with a toolmaker's microscope with the following results:

|  | flank wear |
|---|---|
| Example 1 material | 0.00825 inch |
| Example 2 material | 0.0119 inch |
| Example 3 material | 0.0113 inch |

(TC = thermal conductivity in watts per meter degree Kelvin)

These cutting performance results indicate that the diamond of example 1 performed surprisingly well in this application in comparison to diamond film made at higher methane concentrations. Heretofore, the transparency of the material has not been associated directly with performance in cutting tool applications. The results would seem to indicate that diamond film material made in accordance with the present invention and having an absorption of less than about 10/cm performs particularly well for cutting tool applications. Such a result is unexpected, since other diamond film grown at higher substrate temperatures, above 975 degrees C., and with higher methane concentrations, above 0.07% have previously been shown to also perform well for such applications, despite their having much more non-diamond material in their structure and being highly opaque at thicknesses which are required for free-standing pieces.

GENERAL CONSIDERATIONS

Other carbon-containing compounds can be used in place of methane for generating active gas species in the activated gas mixture: acetone, acetylene, and alcohols have been reported as substitutes. These are expected to give similar results to methane if the concentrations are adjusted appropriately: generally each atom of oxygen bonds firmly to one carbon atom, so that a molecule such as acetone ($CH_3COCH_3$) contributes as much free carbonaceous species as two molecules of methane ($CH_4$). Tightly bonded molecules such as acetylene are less effective in producing diamond than are molecules like methane. However, if the residence time of the acetylene molecule is long enough, it may convert partially to more active species such as methane in flight. If the acetylene (or any other molecule) is injected into the arc, then it is substantially broken up and should count as if the carbon were present as methane (unless oxygen is present). Thus, it would be expected that one could obtain results similar to those described above in accordance with the invention by the use of carbon source gas other than methane and in a concentration equivalent to that of the methane concentration disclosed herein in terms of the resulting active species. Therefore, the invention is not intended to be limited to the use of methane alone as the carbon source gas. Similarly, while here the facilitating gas is hydrogen, it has been shown by those skilled in the art that there may be other gases used to facilitate the growth of diamond films. Finally, while the invention has been described in terms of an arc jet apparatus and while it has been observed that growth of diamond film in other types of apparatus with such low methane concentrations are not likely to be of commercial interest because of their very low growth rates under these conditions, nevertheless, the invention is considered to encompass also other systems for growing diamond by deposition from an activated gas.

What is claimed is:

1. A cutting tool comprising a tool body including a cutter portion, the cutter portion having a flank face and a rake face adjoining each other at a cutting edge, the cutter portion at the cutting edge being of chemical vapor deposited diamond film having an optical absorbance of less than 10 per centimeter.

2. The cutting tool of claim 1, wherein the tool body is a round tool.

3. The cutting tool of claim 2, wherein the diamond film cutter portion comprises the diamond film bonded to a substrate which is fixed to the tool body.

4. The cutting tool of claim 3, wherein the tool body is a milling tool and the diamond film is brazed to a cutting tool insert mechanically fixed to the tool body.

* * * * *